US009616470B1

(12) United States Patent
Nirmalraj

(10) Patent No.: US 9,616,470 B1
(45) Date of Patent: Apr. 11, 2017

(54) CLEANING OF NANOSTRUCTURES

(71) Applicant: International Business Machines Corporation, Armonk, NY (US)

(72) Inventor: Pio Peter N. Nirmalraj, Zurich (CH)

(73) Assignee: INTERNATIONAL BUSINESS MACHINES CORPORATION, Armonk, NY (US)

(\*) Notice: Subject to any disclaimer, the term of this patent is extended or adjusted under 35 U.S.C. 154(b) by 0 days.

(21) Appl. No.: 15/263,819

(22) Filed: Sep. 13, 2016

(51) Int. Cl.

| | |
|---|---|
| *B08B 3/12* | (2006.01) |
| *B08B 7/00* | (2006.01) |
| *B08B 3/08* | (2006.01) |
| *B08B 7/04* | (2006.01) |
| *C01B 31/02* | (2006.01) |
| *C01B 31/04* | (2006.01) |
| *C01B 21/064* | (2006.01) |
| *B08B 6/00* | (2006.01) |

(52) U.S. Cl.
CPC ............ *B08B 7/04* (2013.01); *B08B 3/08* (2013.01); *B08B 3/12* (2013.01); *B08B 6/00* (2013.01); *C01B 21/0648* (2013.01); *C01B 31/0253* (2013.01); *C01B 31/0484* (2013.01)

(58) Field of Classification Search
CPC .... B08B 3/12; B08B 3/10; B08B 3/04; B08B 7/00; B08B 7/028; B08B 7/04; B08B 2220/04; H01L 21/02041; H01L 21/02082; H01L 21/02118; C01B 21/0648; C01B 31/0253; C01B 31/0484
See application file for complete search history.

(56) References Cited

U.S. PATENT DOCUMENTS

| 5,698,175 A | 12/1997 | Hiura et al. |
| 2006/0102208 A1\* | 5/2006 | Jacobson .............. B08B 7/0021 134/56 R |
| 2006/0204427 A1 | 9/2006 | Ghenciu et al. |
| 2015/0202662 A1 | 7/2015 | Li |

FOREIGN PATENT DOCUMENTS

| CN | 103833023 B | 10/2015 |
| WO | 2011057279 A1 | 5/2011 |

OTHER PUBLICATIONS

Acikgoz et al. "Polymers in conventional and alternative lithography for the fabrication of nanostructures.," European Polymer Journal, vol. 47, Issue 11, Nov. 2011, pp. 2033-2052.
Eatemadi et al. "Carbon nanotubes: properties, synthesis, purification, and medical applications." Nanoscale Research Letters 9.1 (2014): 393, pp. 1-13.

\* cited by examiner

*Primary Examiner* — Saeed T Chaudhry
(74) *Attorney, Agent, or Firm* — Cantor Colburn LLP; Daniel Morris

(57) ABSTRACT

The present invention relates to a method for removing a polymeric material from a surface of a nanostructure. The method includes applying, by a scanning probe microscope, an electrical field between a probe tip of the scanning probe microscope and the nanostructure, and simultaneously scanning over the surface of the nanostructure. Thereby, bonds connecting the polymeric material to the surface of the nanostructure are broken. A further step includes cleaning the surface of the nanostructure. A scanning probe microscope for performing such a method and a computer program product for controlling the scanning probe microscope are also disclosed.

13 Claims, 3 Drawing Sheets

CLEANING OF NANOSTRUCTURES

BACKGROUND

The invention relates to a method for removing polymeric materials from a surface of a nanostructure. The invention further relates to a corresponding scanning probe microscope adapted to perform such a method and a corresponding computer program product.

One major challenge for the scaling and commercialization of nanostructures, in particular for 1-dimensional (1D) and 2-dimensional (2D) carbon nanostructures such as carbon nanotubes, graphene and graphene nanoribbons, lies in the efficient post processing of these materials after lithographic processing. The lithographic processing may be e.g. required to connect these materials between metal electrodes to arrange them e.g. in a transistor configuration.

Commonly used polymeric resist materials have a strong affinity and adhesion to carbon nanostructures. Common approaches use chemical or thermal treatment to remove the excessive polymeric materials, e.g. rapid thermal annealing or sample rinsing.

SUMMARY

According to a first aspect, the present invention is embodied as a method for removing a polymeric material from a surface of a nanostructure. The method comprises applying, by a scanning probe microscope, an electrical field between a probe tip of the scanning probe microscope and the nanostructure. The method further comprises scanning over the surface of the nanostructure. Thereby bonds connecting the polymeric material to the surface of the nanostructure are broken. A further step comprises cleaning the surface of the nanostructure.

According to a second aspect, the invention is embodied as a scanning probe microscope. The scanning probe microscope comprises a probe tip having an apex tip area of more than 300 nm$^2$ and a voltage source for applying a bias voltage between the probe tip and a nanostructure. The scanning probe microscope further comprises a sample positioner configured to position the nanostructure in relation to the probe tip and a system controller configured to control the scanning probe microscope. The scanning probe microscope comprises a cleaning mode that is configured to apply an electrical field between the probe tip and the nanostructure and to scan over the surface of the nanostructure in order to break bonds connecting a polymeric material to the surface of the nanostructure.

According to a further aspect, the invention can be embodied as a computer program product for controlling a scanning probe microscope according to the second aspect. The computer program product comprises a computer readable storage medium having stored thereon program instructions executable by the controller of the scanning probe microscope to cause the scanning probe microscope to perform a cleaning mode. The cleaning mode comprises applying an electrical field between the probe tip and the nanostructure and scanning over the surface of the nanostructure. Thereby bonds connecting a polymeric material to the surface of the nanostructure are broken.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

DETAILED DESCRIPTION

Figure 1:
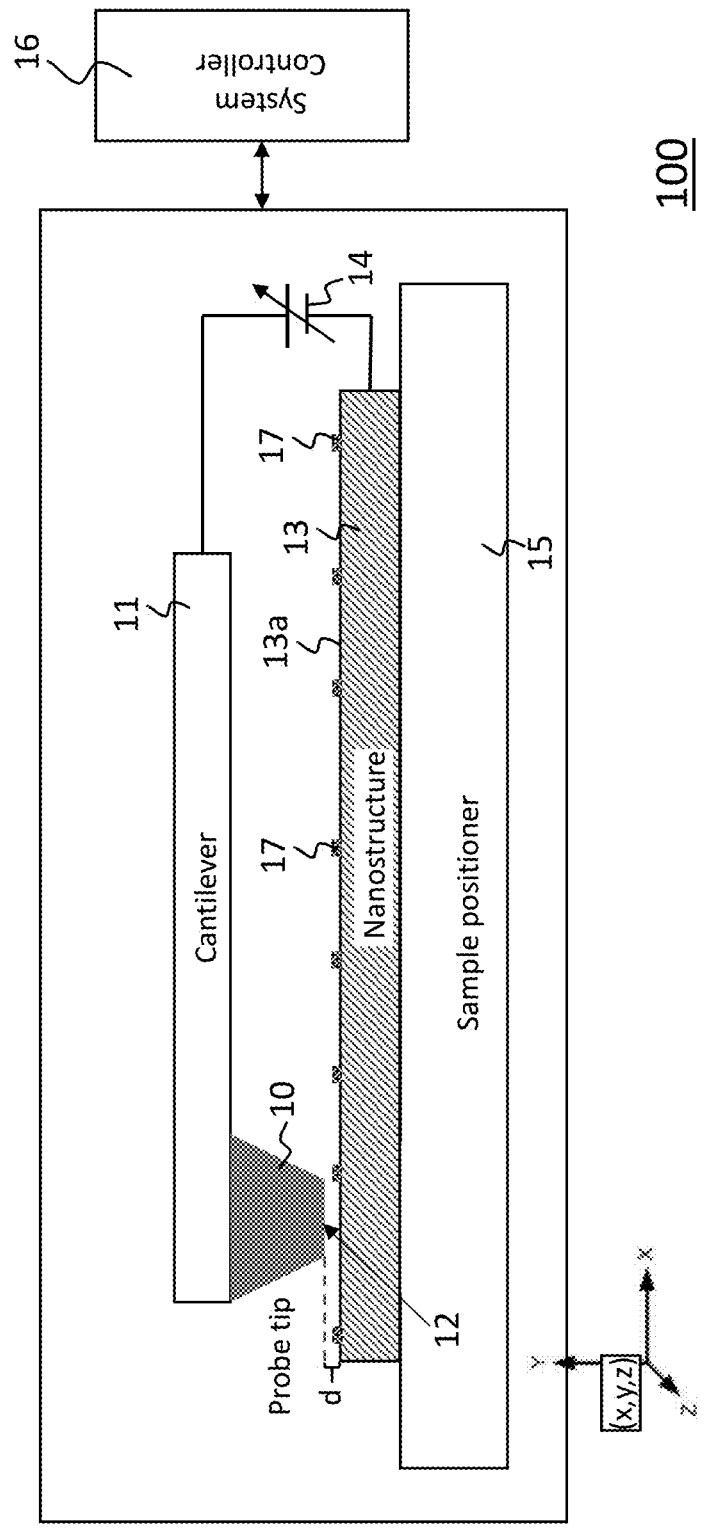
FIG. 1 shows a block diagram of a scanning probe microscope according to an embodiment of the invention.
Figure 2B:
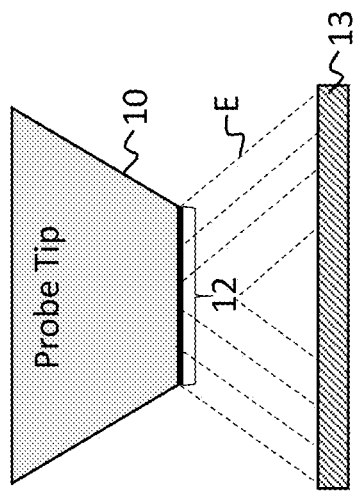
FIG. 2b shows a cross-sectional view of probe tip according to an embodiment of the invention.
Figure 2A:
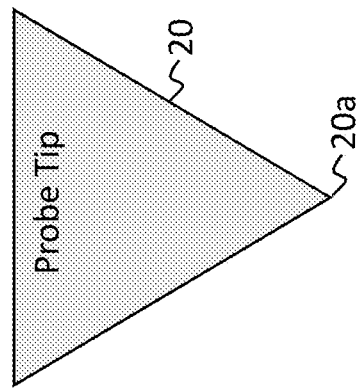
FIG. 2a shows cross sectional view of a probe tip of a conventional atomic force microscope.
Figure 3:
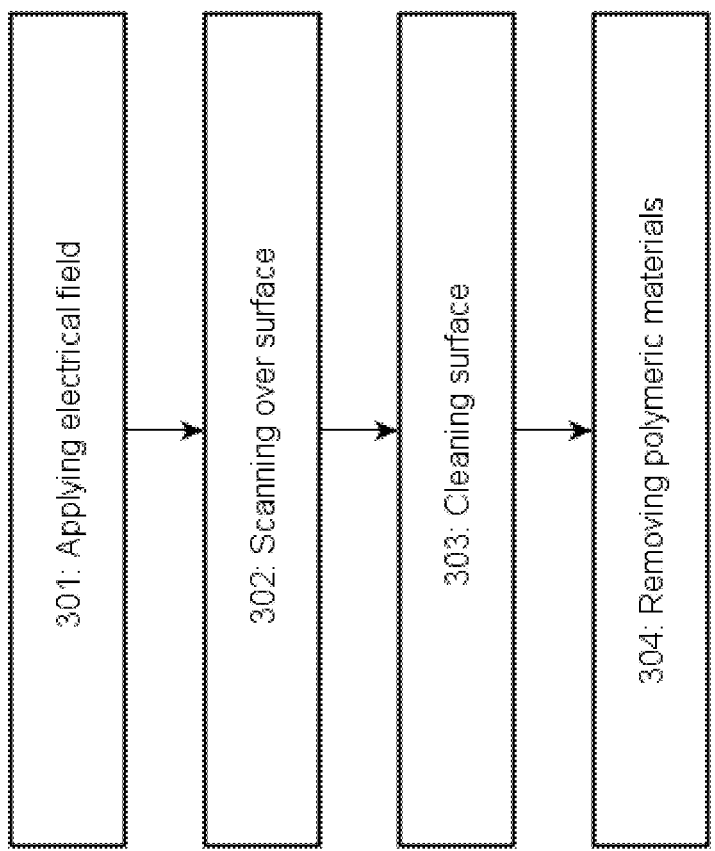
FIG. 3 shows a flow chart of a method for removing polymeric materials from a surface of a nanostructure according to an embodiment of the invention.

In reference to FIGS. 1-3, general aspects of the invention and corresponding terms are first described.

2-dimensional materials, also denoted as 2D materials or single layer materials, may be defined as a class of materials, more particularly a class of nanomaterials, defined by their property of being merely one or two atoms thick. One popular example of a 2-dimensional material is graphene, a material constituted by a single layer of carbon atoms arranged in a hexagonal crystal lattice. 2-dimensional materials are considered to have many interesting applications in particular for future semiconductor technologies.

1-dimensional materials, also denoted as 1D materials, may be defined as nanostructures having a ratio of length to width greater than 1000. 1-dimensional materials are also often referred to as nanowires. The diameter of such nanowires is in the order of tens of a nanometer or less.

Embodiments of the invention provide techniques using a modified scanning probe tip in combination with a locally applied electric field under a specified loading force to break adhesion between polymeric materials and a surface of a nanostructure and to remove the polymeric materials without inducing chemical or electrical alterations to a nanostructure of interest.

FIG. 1 shows a scanning probe microscope 100 according to an embodiment of the invention. The scanning probe microscope 100 is embodied as electrostatic force microscope and is accordingly adapted to apply an electrical field to sample nanostructures of interest. The scanning probe microscope 100 is configured to operate in a non-contact scanning mode, i.e. during operation there is no direct contact between the sample nanostructure and the probe tip.

The scanning probe microscope 100 comprises a probe tip 10 that is arranged on a cantilever 11. The probe tip has preferably an apex tip area 12 of more than 300 nm$^2$. A preferred range of the apex tip area is between 300 nm$^2$ and 10000 nm$^2$. An even more preferred range is between 1000 nm$^2$ and 7500 nm$^2$. The apex tip area 12 is preferably embodied with a flat surface. The apex tip area may be defined as the area that is arranged towards a surface 13a of a nanostructure 13, also referred to as sample nanostructure 13. In other words, the apex tip area 12 is the area of the probe tip 10 that is facing towards the surface 13a of the sample nanostructure 13. The probe tip 10 is coated with a conductive material, e.g. a metal such as gold or platinum.

The scanning probe tip 100 further comprises a controllable voltage source 14 for applying a bias voltage between the probe tip 10 and the sample nanostructure 13. The bias voltage is preferably a DC-bias voltage. According to a preferred embodiment the bias voltage is in a range between 0.5 V and 2 V.

In addition, the scanning probe microscope 100 comprises a sample positioner 15 configured to position the sample nanostructure 13 in relation to the probe tip 10. The sample positioner 15 may position the sample nanostructure 13 in three directions x, y and z as indicated with the arrows. Finally, the scanning probe microscope 100 comprises a system controller 16 that is configured to control the scanning probe microscope 100, e.g. the voltage source 14 and the sample positioner 15.

The scanning probe microscope 100 may comprise various scanning probe modes for performing probe scanning to analyze the surface of nanostructures. These scanning probe modes may operate as known in the art. Furthermore, the scanning probe microscope 100 may be operated in one or more cleaning modes. In the one or more cleaning modes the scanning probe microscope 100 applies an electrical field between the probe tip 10 and the nanostructure 13 in order to break bonds that connect a polymeric material 17 arranged on the surface 13a of the nanostructure 13 to the nanostructure 13. The polymeric material 17 may be e.g. a lithographic resist material that has remained after lithographic processing of the nanostructure 13. In FIG. 1 the polymeric material 17 is represented by small rectangles in a simplified and schematic way to illustrate the principle of embodiments of the invention. The bonds that connect the polymeric material 17 to the nanostructure 13 may be in particular based on adhesive forces.

In the cleaning mode the system controller 16 controls the scanning probe microscope in such a way that a loading force is applied between the probe tip 10 and the nanostructure 13. According to a preferred embodiment the loading force is in a range between 0.5 nN and 10 nN. The loading force is based on the force constant of the cantilever 11 and a distance d between the probe tip 10 and the nanostructure 13. In the cleaning mode the scanning probe microscope 100 operates in non-contact mode and the probe tip 10 experiences an attractive force towards the nanostructure 13. The attractive force is in particular based on van der Waals forces.

The distance d between the probe tip 10 and the sample nanostructure is preferably in a range between 25 nm and 100 nm.

It should be noted that in contrast to a normal AFM non-contact mode, the cantilever 11 is not oscillated during the cleaning mode.

Furthermore, the system controller 16 controls the strength of the electrical field such that the electrical field between the probe tip 10 and the nanostructure 13 is in a range between $10^2$ V/m and $10^6$ V/m. The electrical field can be controlled by the bias voltage of the voltage source 14. The bias voltage of the voltage source 14 is preferably between 0.5 V and 2 V.

According to embodiments the nanostructure 13 may be a carbon nanostructure, e.g. a carbon nanotube, graphene or a graphene nanoribbon. The nanostructure 13 may be embodied as 2-dimensional or as 1-dimensional material such as a nanowire. If embodied as 2-dimensional material, the 2-dimensional material may be in particular graphene, transition metal dichalcogenide (TMD), $MoS_2$, $WS_2$, $WSe_2$ or BN.

According to an embodiment the scanning probe microscope 100 may comprise a tuning fork (not shown) instead of the cantilever 11.

FIG. 2a shows cross sectional view of a probe tip 20 of a conventional atomic force microscope. Accordingly, the probe tip 10 comprises a sharp peak 20a.

FIG. 2b shows a cross-sectional view of probe tip 10 according to an embodiment of the invention. The probe tip 10 comprises an apex tip area 12 that is significantly larger than the area of the peak 20a of the probe tip 20. The probe tip 10 may be fabricated from the probe tip 20 by focused ion beam cutting. FIG. 2b also shows in a schematic way an electrical field E applied between the probe tip 10 and the nanostructure 13.

FIG. 3 shows a flow chart of a method 300 for removing polymeric materials from a surface of a nanostructure according to an embodiment of the invention. Parts of the method may be performed by the scanning probe microscope 100 of FIG. 1 and more particularly be the cleaning mode of the scanning probe microscope 100.

At a step 301, the scanning probe microscope 100 applies an electrical field between the probe tip 10 and the nanostructure 13.

Simultaneously, at a step 302, the probe tip 10 is scanned over the surface 13a of the nanostructure 13 or over a region of interest of the surface 13a of the nanostructure 13. Thereby bonds connecting the polymeric material 17 with the surface 13a of the nanostructure 13 are broken. Accordingly bonds connecting the polymeric material 17 to the surface 13a of the nanostructure 13 can be eliminated by methods embodying the invention in a controlled manner. A part of the polymeric material 17 may be transferred during scanning probe operation to the probe tip 10 and hence may stick to the probe tip 10.

At a step 303, the surface 13a of the nanostructure 13 is cleaned.

Simultaneously and as a result of the cleaning, at a step 304, the remaining part of the polymeric material 17 whose bonds to the surface 13a have been broken in the previous steps is fully removed from the surface 13a.

The cleaning step 303 may be performed by treating the nanostructure 13 in a cleaning liquid. The cleaning liquid has preferably a boiling point of less than 80° C. to avoid that the cleaning liquid sticks to the surface 13a of the nanostructure 13. Preferably an ultrasonication may be performed in the cleaning liquid. The cleaning liquid may be e.g. iso-propyl alcohol. Alternatively or in addition the cleaning step may be performed by blow drying the surface 13a of the nanostructure 13, e.g. with $N_2$ gas.

The method may be preferably performed with an apex tip area 12 of the probe tip 10 in a range between 300 nm2 and 10000 nm2. The method may be preferably performed with a loading force of the scanning probe microscope between 0.5 nN and 10 nN. The strength of the electrical field may be preferably in a range between $10^2$ V/m and $10^6$ V/m.

According to embodiments multiple scans can be performed and the scan speed can be adapted and varied to optimize the overall cleaning results.

According to embodiments of the method the strength of the applied electrical field and the distance between the probe tip and the nanostructure is controlled in such a way that the bonds connecting the polymeric material and the nanostructure are broken.

One advantage of the method embodying the invention is that it may be performed in a scalable and efficient way. Furthermore, it may improve the stability and performance of nanostructures. Methods embodying the invention may effectively remove traces of polymeric materials/residues without changing the material properties such as electrical resistivity and tensile strength of the nanostructure 13.

The applied loading force also creates a local joule heating effect that may additionally serve to defragment the polymeric material without any extra energetic penalty.

The metal coated probe tip may, due to its large apex tip area, efficiently serve to clean large areas of a surface of the nanostructure of interest. Thereby the need for multiple passes to clean the nanostructure may be reduced or avoided. Techniques according to embodiments of the invention may even be scaled further by employing multiple probe tips on the cantilever.

As mentioned above, polymeric materials may be transferred during scanning probe operation to the probe tip 10 and hence may stuck to the probe tip 10. According to embodiments the probe tip 10 may be cleaned after multiple runs to remove these polymeric materials from the probe tip 10.

Aspects of the present invention may be a system, a method, and/or a computer program product. The computer program product may include a computer readable storage medium (or media) having computer readable program instructions thereon for causing a processor to carry out aspects of the present invention.

Aspects of the invention may be in particular embodied as a computer program product for controlling the scanning probe microscope 100 and in particular to perform a cleaning mode of the scanning probe microscope 100. The computer program product may be loaded e.g. into the system controller 16 of the scanning probe microscope 100. The computer program product has a computer readable storage medium having stored thereon program instructions executable by the system controller 16 of the scanning probe microscope 100.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for removing a polymeric material from a surface of a nanostructure, the method comprising:
    applying, by a scanning probe microscope, an electrical field between a probe tip of the scanning probe microscope and the nanostructure;
    scanning over the surface of the nanostructure, thereby breaking bonds connecting the polymeric material to the surface of the nanostructure; and
    cleaning the surface of the nanostructure.

2. A method according to 1, wherein an apex tip area of the probe tip is greater than 300 nm$^2$.

3. A method as claimed in claim 1, wherein the scanning probe microscope is embodied as electrostatic force microscope.

4. A method as claimed in claim 1, wherein a loading force of the scanning probe microscope is between 0.5 nN and 10 nN.

5. A method as claimed in claim 1, wherein the strength of the electrical field is in a range between $10^2$ V/m and $10^6$ V/m.

6. A method as claimed in claim 1, wherein the polymeric material is a lithographic resist material.

7. A method as claimed in claim 1, wherein the nanostructure comprises carbon.

8. A method as claimed in claim 1, wherein the nanostructure is a 2-dimensional material.

9. A method as claimed in claim 8, wherein the 2-dimensional material is selected from the group of: graphene; transition metal dichalcogenide (TMD); $MoS_2$; $WS_2$; $WSe_2$ and BN.

10. A method as claimed in claim 1, wherein the nanostructure is a 1-dimensional material.

11. A method as claimed in claim 1, wherein the cleaning step comprises treating the nanostructure in a cleaning liquid having a boiling point of less than 80° C.

12. A method as claimed in claim 11, wherein the cleaning step comprises ultrasonication in the cleaning liquid.

13. A method as claimed in claim 1, wherein the cleaning step comprises blow drying the surface of the nanostructure.

\* \* \* \* \*